United States Patent
Zhao et al.

(10) Patent No.: US 8,415,961 B1
(45) Date of Patent: Apr. 9, 2013

(54) MEASURING SHEET RESISTANCE AND OTHER PROPERTIES OF A SEMICONDUCTOR

(75) Inventors: Guoheng Zhao, Milpitas, CA (US); Alex Salnik, San Jose, CA (US); Lena Nicolaides, Castro Valley, CA (US); Ady Levy, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 323 days.

(21) Appl. No.: 12/961,932

(22) Filed: Dec. 7, 2010

(51) Int. Cl.
*G01R 27/08* (2006.01)
*G01R 31/308* (2006.01)

(52) U.S. Cl.
USPC ..................................... 324/702; 324/754.23

(58) Field of Classification Search .................. 324/702, 324/691, 649, 600, 500, 501, 537, 96, 76.11, 324/762.05, 762.01, 754.23, 754.21, 754.01; 702/118, 117, 108, 64, 57, 1
See application file for complete search history.

(56) References Cited

U.S. PATENT DOCUMENTS

| | | | |
|---|---|---|---|
| 5,049,816 A * | 9/1991 | Moslehi | 324/762.02 |
| 5,442,297 A * | 8/1995 | Verkuil | 324/702 |
| 6,657,439 B1 * | 12/2003 | Harada | 324/600 |
| 7,019,513 B1 * | 3/2006 | Faifer et al. | 324/754.23 |
| 7,362,088 B1 * | 4/2008 | Faifer et al. | 324/702 |
| 7,499,168 B2 * | 3/2009 | Salnik et al. | 356/432 |
| 7,663,393 B2 * | 2/2010 | Everaert et al. | 324/754.09 |
| 7,741,833 B1 * | 6/2010 | Faifer et al. | 324/754.23 |

* cited by examiner

*Primary Examiner* — Hoai-An D Nguyen
(74) *Attorney, Agent, or Firm* — Suiter Swantz pc llo

(57) ABSTRACT

A method may include illuminating a first area of a semiconductor utilizing a light source. The method may also include measuring at least one characteristic of electrical energy transmission utilizing a probe for placing at least one of at or near the illuminated first area of the semiconductor. The method may further include varying the measured at least one characteristic of the electrical energy transmission generated by the light from the light source incident upon the semiconductor while maintaining an intensity of the light source. Further, the method may include determining a sheet resistance for the junction of the semiconductor utilizing the varied at least one characteristic of the electrical energy transmission.

24 Claims, 7 Drawing Sheets

MEASURING SHEET RESISTANCE AND OTHER PROPERTIES OF A SEMICONDUCTOR

TECHNICAL FIELD

The present disclosure generally relates to the field of semiconductors, and more particularly to a system and method for measuring sheet resistance and other properties or a semiconductor.

BACKGROUND

Semiconductors, including solar cells and the like, are often constructed from a doped negative-type (n-type) semiconductor portion joined together with a doped positive-type (p-type) semiconductor portion.

SUMMARY

A method for measuring the sheet resistance and other properties of a semiconductor material may include illuminating a first area of a semiconductor utilizing a light source. The semiconductor may include a doped negative-type semiconductor portion joined together with a doped positive-type semiconductor portion. The method may also include measuring at least one characteristic of electrical energy transmission utilizing a probe for placing at least one of at or near the illuminated first area of the semiconductor. The electrical energy transmission may be generated by the light from the light source incident upon the semiconductor. The method may further include varying the measured at least one characteristic of the electrical energy transmission generated by the light from the light source incident upon the semiconductor while maintaining an intensity of the light source. Further, the method may include determining a sheet resistance for the junction between the doped negative-type semiconductor material and the doped positive-type semiconductor material utilizing the varied at least one characteristic of the electrical energy transmission.

A system may include a light source for illuminating a first area of a semiconductor. The semiconductor may include a doped negative-type semiconductor portion joined together with a doped positive-type semiconductor portion. The system may also include a probe for placing at least one of at or near the illuminated first area of the semiconductor for measuring at least one characteristic of electrical energy transmission generated by the light from the light source incident upon the semiconductor. The system may further include control programming for varying the measured at least one characteristic of the electrical energy transmission generated by the light from the light source incident upon the semiconductor while maintaining an intensity of the light source. Further, the system may include a processor for determining a sheet resistance for the junction between the doped negative-type semiconductor material and the doped positive-type semiconductor material utilizing the varied at least one characteristic of the electrical energy transmission.

A method may include illuminating a first area of a semiconductor utilizing a light source. The semiconductor may include a doped negative-type semiconductor portion joined together with a doped positive-type semiconductor portion. The method may also include measuring at least one characteristic of electrical energy transmission utilizing a probe for placing at least one of at or near the illuminated first area of the semiconductor. The electrical energy transmission may be generated by the light from the light source incident upon the semiconductor. The method may further include varying the measured at least one characteristic of the electrical energy transmission generated by the light from the light source incident upon the semiconductor while maintaining an intensity of the light source. Further, the method may include determining a sheet resistance for the junction between the doped negative-type semiconductor material and the doped positive-type semiconductor material utilizing the varied at least one characteristic of the electrical energy transmission. The method may also include correlating at the measured at least one characteristic of electrical energy transmission and/or the determined sheet resistance for the junction of the semiconductor to determine an additional property of the semiconductor.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Figure 1:
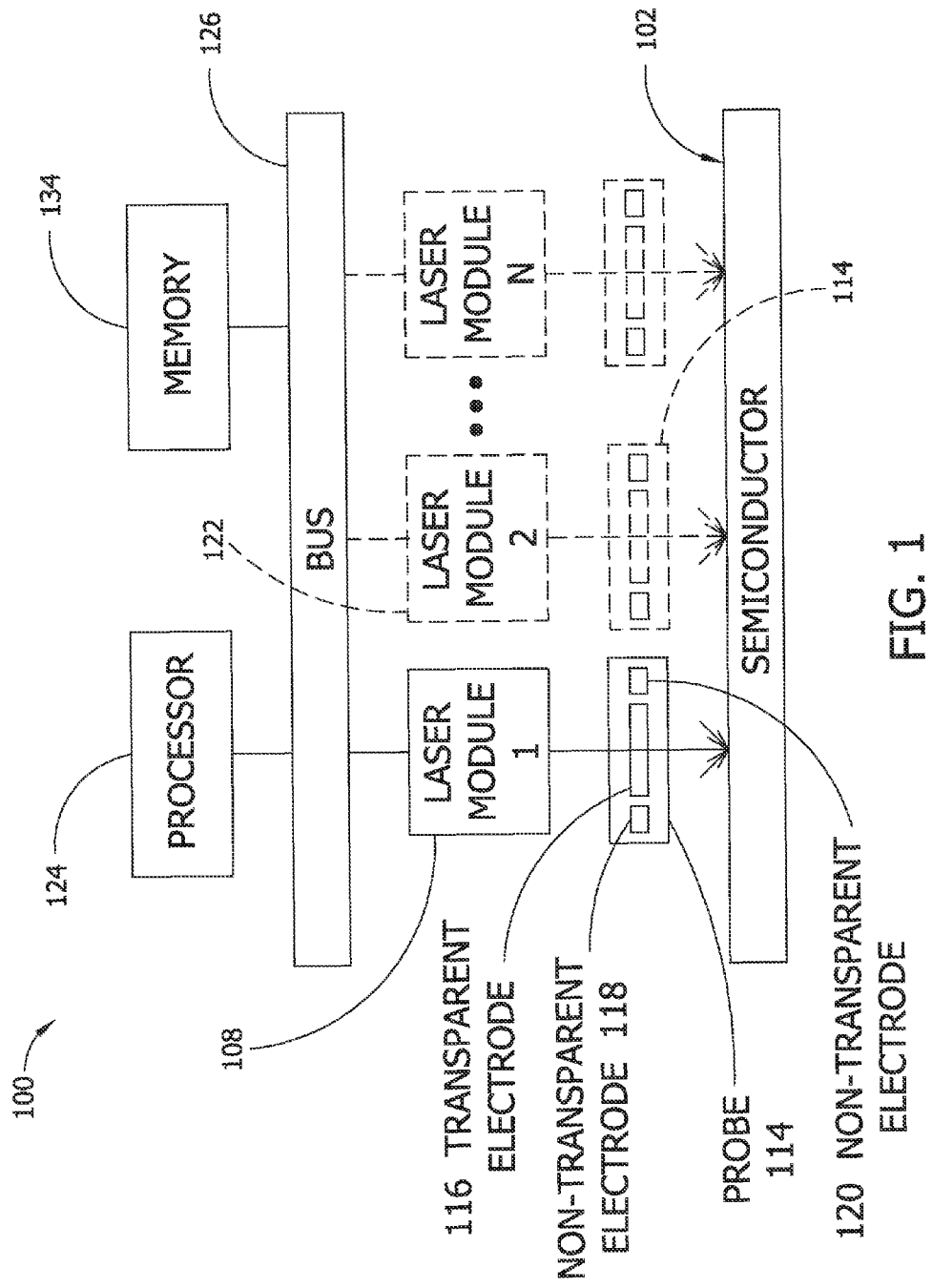
FIG. 1 is a block diagram illustrating a system for determining a sheet resistance for a semiconductor.
Figure 2:
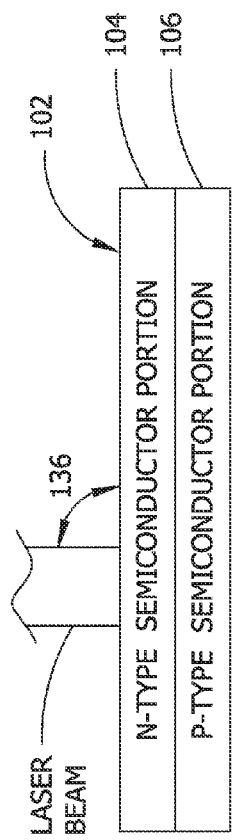
FIG. 2 is a side elevation view illustrating a semiconductor.

Reference will now be made in detail to the subject matter disclosed, which is illustrated in the accompanying drawings.

Referring generally to FIGS. 1 through 5, a system 100 for determining a sheet resistance (Rs) for the junction of a semiconductor 102 (e.g., a solar cell) including a doped negative-type (n-type) semiconductor portion 104 joined together with a doped positive-type (p-type) semiconductor portion 106 is described in accordance with the present disclosure. The system 100 includes a light source (e.g., a Direct Current (DC)/constant intensity light source such as laser module 108) for illuminating a first area 110 (and possibly a second area 112) of the semiconductor 102. The system 100 also includes a probe 114 for placing at or near the illuminated first area 110 of the semiconductor 102. The probe 114 is configured for measuring one or more characteristics of electrical energy transmission generated by the light from the laser module 108 incident upon the semiconductor 102. For example, the probe 114 may be configured for measuring characteristics such as current and/or voltage generated between the laser spot illuminating the first area 110 (and/or the second area 112) and a distal sensing point (e.g., at a location proximal to an electrode).

In some embodiments, the probe 114 may be a non-contact probe. For example, the probe 114 may utilize a first transparent electrode 116 (e.g., a first non-contact arc electrode) and a second non-transparent electrode 118 (e.g., a second non-contact arc electrode) positioned at a predetermined distance above the sample at and/or near the illuminated first area 110 of the semiconductor 102. By placing the probe 114 at or near the illuminated first area 110 of the semiconductor 102, electrical energy transmission may be generated between the first transparent electrode 116 and the second non-transparent electrode 118. For example, under strong inversion surface conditions, a Surface PhotoVoltage (SPV) signal may propagate outside the illuminated first area 110 of the semiconductor 102 due to the generation of photoelectrons. Because the SPV signal may depend strongly on the Rs of the upper layer of the junction between the doped n-type semiconductor portion 104 and the doped p-type semiconductor portion 106, non-contact determination of the Rs may be performed utilizing the resultant SPV signal. It should be noted that this technique may sometimes be referred to as Junction PhotoVoltage (JPV) technology.

In other embodiments, the probe 114 may be a contact probe (i.e., the probe may contact the surface of the semiconductor 102). For example, the first transparent electrode 116 and/or the second non-transparent electrode 118 may be point electrodes for contacting wiring on the surface of the semiconductor 102. In some embodiments, contact probes may be utilized for determining sheet resistance for a sample material with known properties. Alternatively, a contact probe may be utilized to calibrate a measurement for a sample, and then a non-contact probe may be utilized for taking additional measurements (which may subsequently be compared to the calibrated measurement).

While contact and non-contact probes for measuring SPV signals generated by the light from the laser module 108 incident upon the semiconductor 102 have been described with some specificity, it will be appreciated that these implementations have been provided by way of example only, and other various probes for measuring characteristics of the semiconductor 102 may be utilized in accordance with the present disclosure. Furthermore, it will be appreciated that more than one transparent electrode and/or more than one non-transparent electrode may be utilized in accordance with the present disclosure (e.g., for measuring more than one SPV signal at a time). For instance the probe 114 may include a third non-transparent electrode 120, or the like.

The system 100 may include control programming for varying the measured characteristic of the electrical energy transmission generated by the light from the laser module 108 incident upon the semiconductor 102, while still maintaining the intensity of the laser module 108. For instance, laser module 108 (and possibly a second laser module 122) may be connected to a processor 124 via a bus 126. The laser module 108 (or possibly the second laser module 122) may be utilized for illuminating a second area 112 of the semiconductor 102, the second area 112 being at least substantially different in size from the first area 110 (e.g., utilizing a laser module optical focusing system controlled by the processor 124). For example, the size of the light beam from the laser module 108 may be varied from one spot size covering the first area 110 to another spot size covering the second area 112, and the sheet resistance of the semiconductor 102 may be calculated from measurements at the different spot sizes. It will be appreciated that by utilizing a constant intensity light source, a wavelength may be selected that has desirable beam absorption characteristics for the semiconductor 102.

In embodiments, the size of the beam may be varied periodically (e.g., the beam size may be harmonically modulated). For example, the processor 124 may be configured for modulating the beam size for the laser module 108 and/or the second laser module 122 at a frequency selected from a range of between at least approximately 10 Hertz (Hz) and at least approximately 10 megahertz (MHz). Then, Alternating Current (AC) SPV signals on the transparent and non-transparent electrodes may be measured utilizing lock-in detection techniques (e.g., utilizing a lock-in amplifier or the like). It should be noted that various techniques may be utilized for varying the size of the beam. For instance, the laser module optical focusing system may include a lens for focusing laser light. The lens may be moved between two or more positions to change the beam spot size. Alternatively, a distance between a laser module and the semiconductor may be changed while keeping the position of the lens constant. Further, it is contemplated that the lens may be moved in combination with changing the distance between the laser module and the semiconductor.

Figure 3:
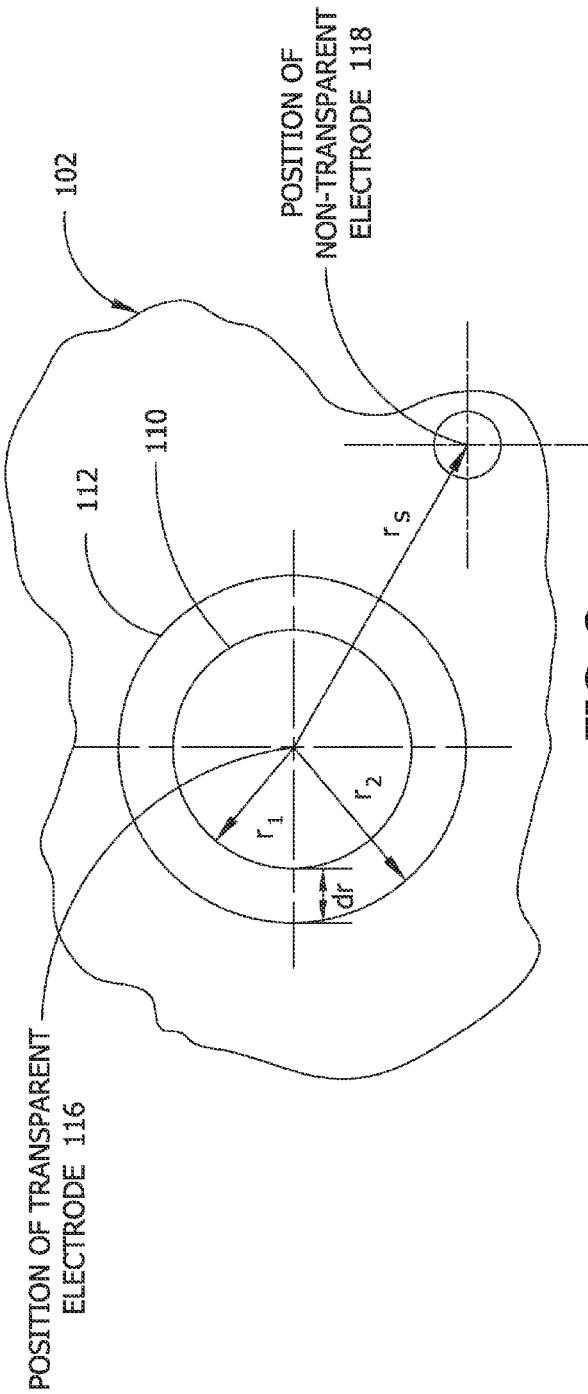
FIG. 3 is a top plan view illustrating the semiconductor shown in FIG. 2, where a laser beam module is utilized to illuminate two areas of the semiconductor.

With reference to FIG. 3, in embodiments where the size of the light beam from the laser module is varied, the following set of equations may be utilized to determine the R square sheet resistance of the semiconductor 102, where $r_s$ represents a sensing radius (e.g., the distance between the first transparent electrode 116 and the second non-transparent electrode 118), $r_1$ and $r_2$ represent laser beam radii for the first area 110 and the second area 112, respectively, $\rho$ represents a resistivity for the semiconductor 102, dr represents an incremental difference in radius, h represents an emitter layer thickness (e.g., the thickness of the n-type semiconductor portion 104), and $R_{sq}$ represents a sheet resistance for the semiconductor 102 (i.e., the semiconductor resistivity p divided by the emitter layer thickness h). The resistance R of the emitter layer between the two circles with radii of $r_1$ and $r_2$ is given by:

$$R = \int_{r_1}^{r_s} \frac{\rho \, dr}{2\pi r h}, \quad (1)$$

$$R = \frac{\rho}{2\pi h} \ln\left(\frac{r_s}{r_1}\right), \quad (2)$$

$$= \frac{R_{sq}}{2\pi} \ln\left(\frac{r_s}{r_1}\right),$$

and the change of resistance dR due to the change of laser beam radius from $r_1$ to $r_2$ is given by:

$$dR = \frac{R_{sq}}{2\pi} \ln\left(\frac{r_s}{r_1}\right). \quad (3)$$

Figure 4:
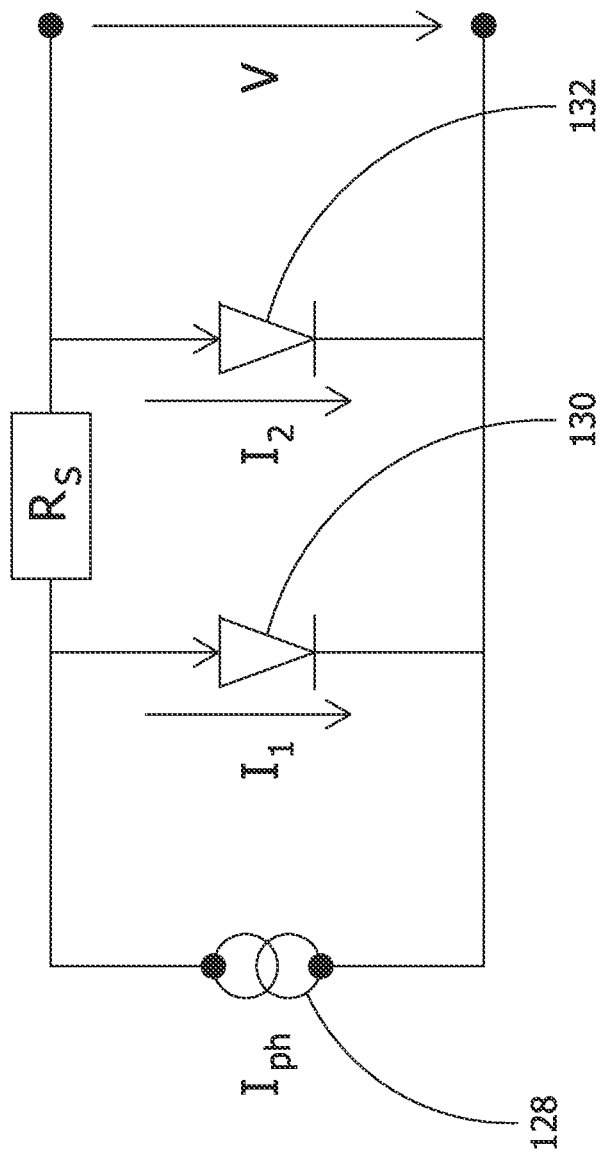
FIG. 4 is a circuit diagram modeling the semiconductor and electrical energy transmission generated by the laser beam shown in FIG. 2.

With reference to FIG. 4, the semiconductor 102 may be modeled as a circuit including a current source and two diodes, where the current source 128 represents the photocurrent generated by the laser beam, the first diode 130 is positioned under the laser beam, and the second diode 132 is positioned under the distal electrode of the probe. The following equations may then be utilized to describe the relationships between the various parameters:

$$I_{ph} = I_0 \left( e^{\frac{q(V+I_2R)}{AKT}} - 1 \right) + I_2 \quad (4)$$

$$I_2 = I_0 \left( e^{\frac{qV}{AKT}} - 1 \right)$$

$$I_{ph} = I_0 \left\{ \exp\left[ \frac{qV + qI_0R\left(e^{\frac{qV}{AKT}} - 1\right)}{AKT} \right] - 1 \right\} + I_0\left(e^{\frac{qV}{AKT}} - 1\right)$$

where q represents the elementary charge of an electron, K represents Boltzmann's constant, T represents absolute temperature, A represents diode ideality factor, $I_0$ represents the reverse saturation current, R represents the resistance given by equation (2), $I_{ph}$ represents the photocurrent generated by the illuminating beam, $I_2$ represents the current flowing through the second diode, and V represents voltage drop across the second diode 132, which is the voltage to be measured by the sensing probe.

It should be noted that the resistance R changes with laser beam size, as described by equation (3), which results in the change of voltage V, as described by equation (4). In this manner, sheet resistance may be derived from measuring voltage change as a function of laser beam size change. Further, values for other parameters in equations (3) and (4) may be obtained either through prior knowledge, and/or through measuring a calibration sample having known sheet resistance. In the present example, where the laser intensity does not change, $I_{ph}$ may be considered constant. It will be appreciated that the modulation of output voltage as a result of modulating resistance may be more sensitive to the sheet resistance, therefore measurements in accordance with the present disclosure may achieve a high degree of accuracy when $I_{ph}$ is modulated while R remains constant. Thus, in example embodiments where the size of the light beam from the laser module is varied, the processor 124 may utilize the above-described relationships for determining the sheet resistance for the junction between the n-type semiconductor portion 104 and the p-type semiconductor portion 106 utilizing the varied characteristic (e.g., voltage) of electrical energy transmission. The system 100 may also include a memory 134 coupled to the processor 124 via the bus 126 for storing the measured characteristics of energy transmission and/or the sheet resistance determined for the semiconductor 102.

Figure 6:
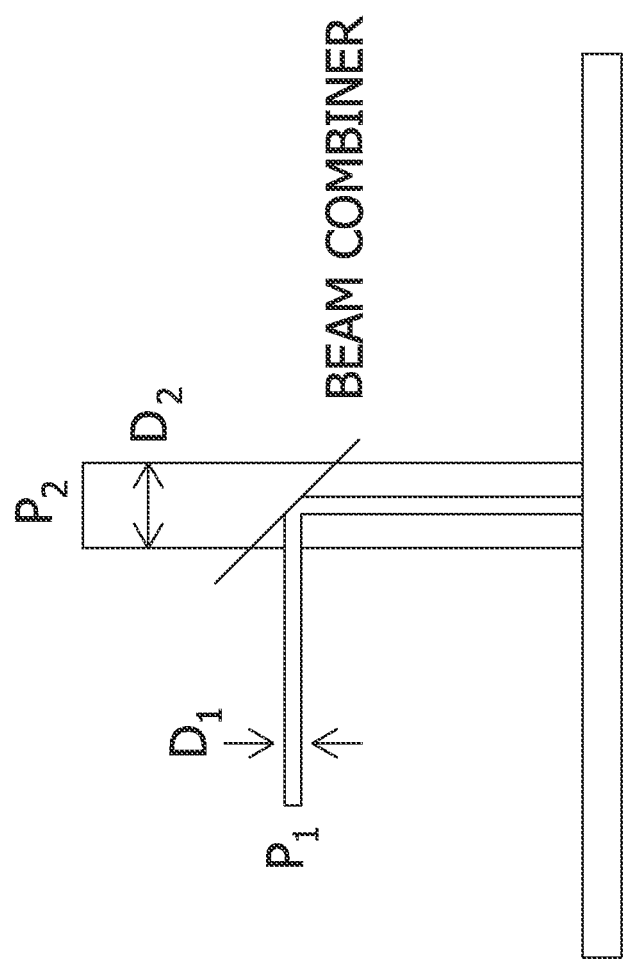
FIG. 6 is a side elevation view illustrating a beam combiner for combining two laser beams into a single beam.
Figure 7:
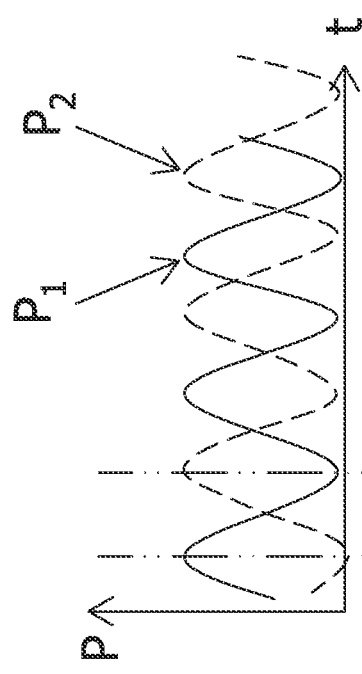
FIG. 7 is a first graph illustrating the powers of two laser beams that are 180 degrees out of phase from one another.
Figure 8:
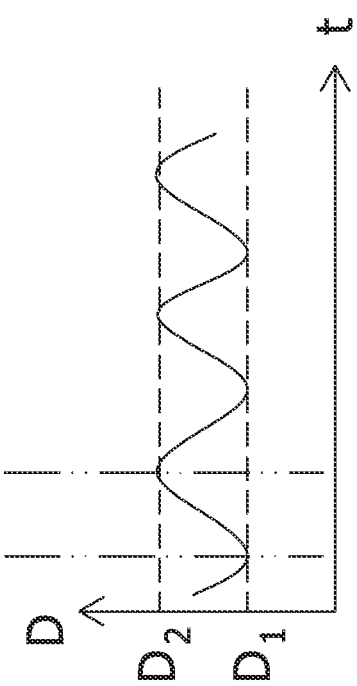
FIG. 8 is a second graph illustrating the diameter of a laser beam generated from two laser beams combined utilizing a beam combiner.
Figure 9:
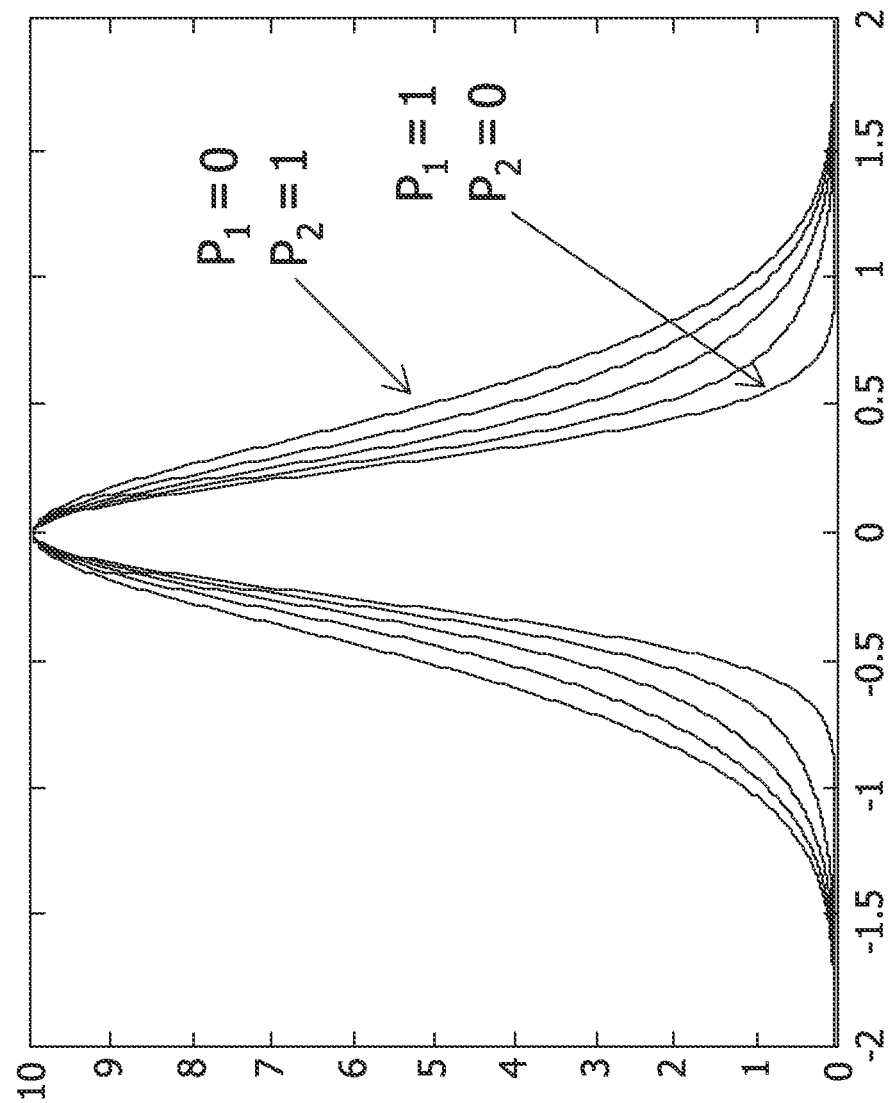
FIG. 9 is a plot illustrating a combined beam profile for two laser beams having 2:1 beam size at various intensity ratios.

While laser beam size may be mechanically modulated in various ways, such as by moving lens elements, utilizing zoom lenses, and the like, the laser beam size may also be changed electronically, which may provide a high degree of frequency modulation. For example, as illustrated in FIG. 6, a first laser beam having power $P_1$ and diameter $D_1$ may be combined with a second laser beam having power $P_2$ and diameter $D_2$. The first laser beam and the second laser beam may be combined into a third laser beam utilizing a beam combiner. While the intensity of the first and second laser beams may be modulated at the same frequency, the beams may be out of phase with one another (e.g., 180 degrees out of phase, as illustrated in FIG. 7). Thus, the effective beam size changes between $D_1$ and $D_2$, at the same modulation frequency (as illustrated in FIG. 8). Because the laser intensity may be modulated at high frequency (e.g., with an electro-optical modulator, with the direct current modulation of diode lasers, or the like), this technique may allow for high frequency modulation of laser beam size to enable measuring other high frequency response properties. FIG. 9 illustrates a plot of the combined beam profile of two Gaussian beams having 2:1 beam size at various intensity ratios. It should be noted that this plot is provided by way of example only, and is not meant to limit the present disclosure. Other types of laser beams having other beam sizes may be utilized with the present disclosure.

While varying the spot size of the laser beam from the laser module 108 has been described with some specificity, it will be appreciated that other techniques for varying one or more characteristics of electrical energy transmission generated by light incident upon the semiconductor 102 may be utilized in accordance with the present disclosure. For instance, the laser module 108 (or possibly the second laser module 122) may be utilized for illuminating a third area of the semiconductor 102, the third area being at least substantially different in location from the first area 110. Thus, the size of the light beam from the laser module 108 may be varied from a spot size covering the first area 110 to another spot size covering the third area, and the sheet resistance of the semiconductor 102 may be calculated from measurements for the different locations. In some embodiments, measurements for both locations may be made utilizing the first probe 114, while in other embodiments, two or more probes 114 may be utilized. In embodiments, the location of the beam may be varied periodically (e.g., the beam location may be harmonically modulated).

In embodiments, the laser module optical focusing system controlled by the processor 124 may be utilized for varying an angle of incidence 136 of the light from the laser module 108 to the semiconductor 102. In this manner, the measured characteristic of the electrical energy transmission generated by the light from the laser module 108 incident upon the semiconductor 102 may be varied, while still maintaining the intensity of the laser module 108. For instance, the laser module 108 (or possibly the second laser module 122) may be utilized for illuminating the second area 112 of the semiconductor 102 by changing the angle of incidence 136 of the laser beam to the semiconductor 102. In another example, the laser module 108 (or possibly the second laser module 122) may be utilized for illuminating the third area of the semiconductor 102 (in a different location from the first area 110 as previously described) by changing the angle of incidence 136 of the laser beam to the semiconductor 102.

In still further embodiments, varying one or more characteristics of electrical energy transmission generated by light incident upon the semiconductor 102 may be accomplished by varying the position of the electrodes with respect to the illuminated area on the surface of the sample, varying the size of the electrodes, and/or varying their vertical position with respect to the sample. It will be appreciated that one or more of the above-referenced techniques may be utilized with any of the other previously described techniques in accordance with the present disclosure.

In embodiments, the processor 124 may be utilized for correlating one or more of (A) the measured characteristic of electrical energy transmission and (B) the sheet resistance for the junction of the semiconductor 102 to determine one or more additional properties of the semiconductor 102 in addition to the sheet resistance (e.g., additional properties of the p-n junction of the semiconductor 102). For example, in embodiments, one or more measured voltages may be utilized to determine a resistivity for the semiconductor 102 (as previously described). Then, the resistivity may be correlated to other properties/parameters for the semiconductor 102, including a time-life of minority carriers and/or a diffusion length of minority carriers. In embodiments, equations and/or other relationships for correlating parameters to one another may be stored in the memory 134 and utilized by the processor 124.

Figure 5:
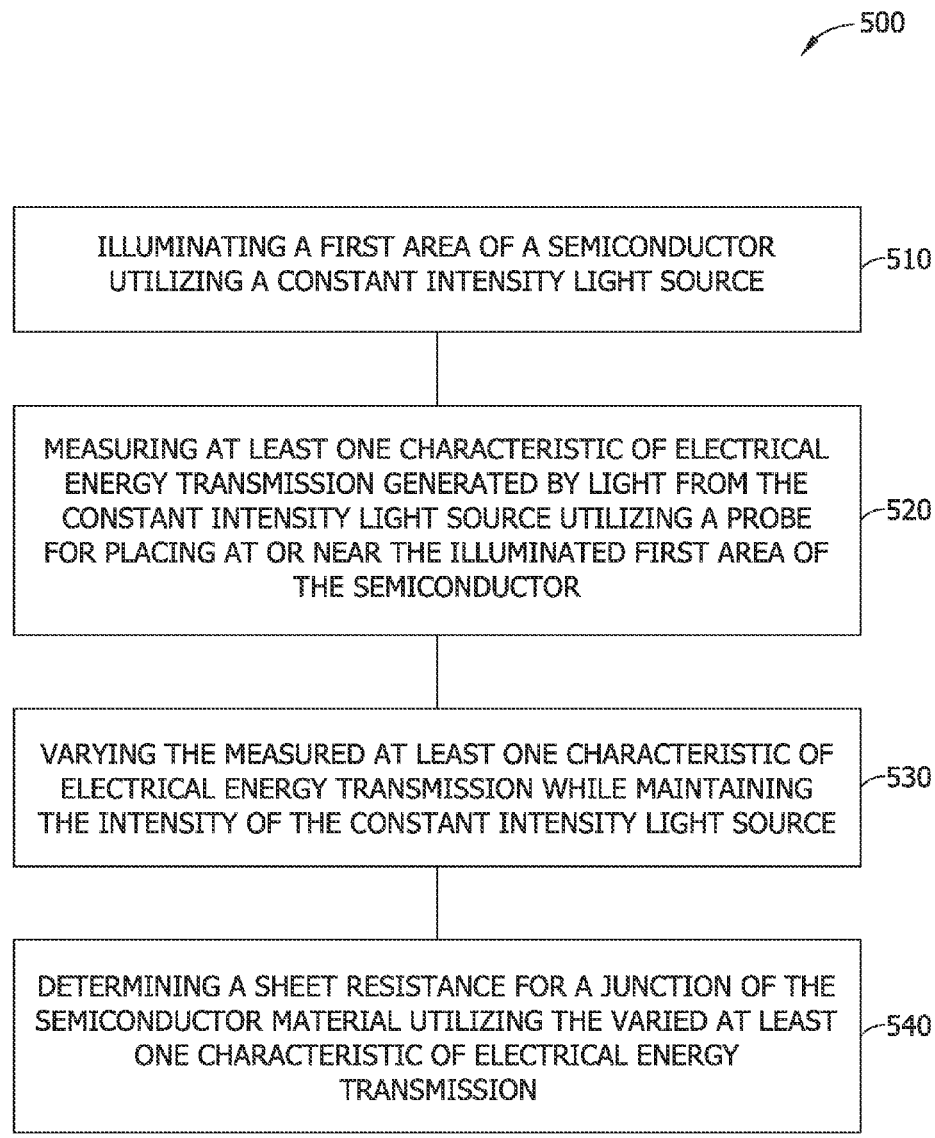
FIG. 5 is a block diagram illustrating a method for determining a sheet resistance for a semiconductor.

Referring now to FIG. 5, a method 500 may include illuminating a first area of a semiconductor utilizing a light source, 510. The semiconductor may include a doped negative-type semiconductor portion joined together with a doped positive-type semiconductor portion. The method may also include measuring at least one characteristic of electrical energy transmission utilizing a probe for placing at least one of at or near the illuminated first area of the semiconductor, 520. The electrical energy transmission may be generated by the light from the light source incident upon the semiconductor. The method may further include varying the measured at least one characteristic of the electrical energy transmission generated by the light from the light source incident upon the semiconductor while maintaining the intensity of the light source, 530. Further, the method may include determining a sheet resistance for the junction between the doped negative-type semiconductor material and the doped positive-type semiconductor material utilizing the varied at least one characteristic of the electrical energy transmission, 540.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method, comprising:
    illuminating a first area of a semiconductor utilizing a light source, the semiconductor including a doped negative-type semiconductor portion joined together with a doped positive-type semiconductor portion;
    measuring at least one characteristic of electrical energy transmission utilizing a probe for placing at least one of at or near the illuminated first area of the semiconductor, the electrical energy transmission generated by the light from the light source incident upon the semiconductor;
    varying the measured at least one characteristic of the electrical energy transmission generated by the light from the light source incident upon the semiconductor while maintaining an intensity of the light source; and
    determining a sheet resistance for the junction between the doped negative-type semiconductor material and the doped positive-type semiconductor material utilizing the varied at least one characteristic of the electrical energy transmission.

2. The method of claim 1, wherein varying the measured at least one characteristic of the electrical energy transmission generated by the light from the light source incident upon the semiconductor while maintaining the intensity of the light source comprises:
    illuminating a second area of the semiconductor, the second area being at least substantially different in size from the first area.

3. The method of claim 2, further comprising:
    modulating a beam size for the light source at a frequency selected from a range of between at least approximately 10 Hz and at least approximately 10 MHz.

4. The method of claim 2, further comprising:
    modulating a beam size for the light source by combining the light from a first laser beam and a second laser beam.

5. The method of claim 1, wherein varying the measured at least one characteristic of the electrical energy transmission generated by the light from the light source incident upon the semiconductor while maintaining the intensity of the light source comprises:
    illuminating a second area of the semiconductor, the second area being at least substantially different in location from the first area.

6. The method of claim 1, wherein varying the measured at least one characteristic of the electrical energy transmission generated by the light from the light source incident upon the semiconductor while maintaining the intensity of the light source comprises:
    varying an angle of incidence of the light from the light source to the semiconductor.

7. The method of claim 6, wherein varying an angle of incidence of the light from the light source to the semiconductor comprises:
    illuminating a second area of the semiconductor, the second area being at least substantially different in at least one of size or location from the first area.

8. The method of claim 1, further comprising:
    correlating at least one of the measured at least one characteristic of electrical energy transmission or the determined sheet resistance for the junction of the semiconductor to determine an additional property of the semiconductor.

9. The method of claim 1, wherein the measured at least one characteristic of electrical energy transmission includes at least one of current or voltage.

10. A system, comprising:
    a light source for illuminating a first area of a semiconductor, the semiconductor including a doped negative-type semiconductor portion joined together with a doped positive-type semiconductor portion;
    a probe for placing at least one of at or near the illuminated first area of the semiconductor for measuring at least one characteristic of electrical energy transmission generated by the light from the light source incident upon the semiconductor;
    control programming for varying the measured at least one characteristic of the electrical energy transmission generated by the light from the light source incident upon the semiconductor while maintaining an intensity of the light source; and
    a processor for determining a sheet resistance for the junction between the doped negative-type semiconductor material and the doped positive-type semiconductor material utilizing the varied at least one characteristic of the electrical energy transmission.

11. The system of claim 10, wherein the control programming is configured for illuminating a second area of the semiconductor, the second area being at least substantially different in size from the first area.

12. The system of claim 11, wherein the control programming is further configured for modulating a beam size for the light source at a frequency selected from a range of between at least approximately 10 Hz and at least approximately 10 MHz.

13. The system of claim 11, further comprising:
a beam combiner for combining the light from a first laser beam and a second laser beam for modulating a beam size for the light source.

14. The system of claim 10, wherein the control programming is configured for illuminating a second area of the semiconductor, the second area being at least substantially different in location from the first area.

15. The system of claim 10, wherein the control programming is configured for varying an angle of incidence of the light from the light source to the semiconductor.

16. The system of claim 15, wherein the control programming is further configured for illuminating a second area of the semiconductor, the second area being at least substantially different in at least one of size or location from the first area.

17. The system of claim 10, wherein the processor is configured for correlating at least one of the measured at least one characteristic of electrical energy transmission or the determined sheet resistance for the junction of the semiconductor to determine an additional property of the semiconductor.

18. A method, comprising:
illuminating a first area of a semiconductor utilizing a light source, the semiconductor including a doped negative-type semiconductor portion joined together with a doped positive-type semiconductor portion;
measuring at least one characteristic of electrical energy transmission utilizing a probe for placing at least one of at or near the illuminated first area of the semiconductor, the electrical energy transmission generated by the light from the light source incident upon the semiconductor;
varying the measured at least one characteristic of the electrical energy transmission generated by the light from the light source incident upon the semiconductor while maintaining an intensity of the light source;
determining a sheet resistance for the junction between the doped negative-type semiconductor material and the doped positive-type semiconductor material utilizing the varied at least one characteristic of the electrical energy transmission; and
correlating at least one of the measured at least one characteristic of electrical energy transmission or the determined sheet resistance for the junction of the semiconductor to determine an additional property of the semiconductor.

19. The method of claim 18, wherein varying the measured at least one characteristic of the electrical energy transmission generated by the light from the light source incident upon the semiconductor while maintaining the intensity of the light source comprises:
illuminating a second area of the semiconductor, the second area being at least substantially different in size from the first area.

20. The method of claim 19, further comprising:
modulating a beam size for the light source at a frequency selected from a range of between at least approximately 10 Hz and at least approximately 10 MHz.

21. The method of claim 19, further comprising:
modulating a beam size for the light source by combining the light from a first laser beam and a second laser beam.

22. The method of claim 18, wherein varying the measured at least one characteristic of the electrical energy transmission generated by the light from the light source incident upon the semiconductor while maintaining the intensity of the light source comprises:
illuminating a second area of the semiconductor, the second area being at least substantially different in location from the first area.

23. The method of claim 18, wherein varying the measured at least one characteristic of the electrical energy transmission generated by the light from the light source incident upon the semiconductor while maintaining the intensity of the light source comprises:
varying an angle of incidence of the light from the light source to the semiconductor.

24. The method of claim 23, wherein varying an angle of incidence of the light from the light source to the semiconductor comprises:
illuminating a second area of the semiconductor, the second area being at least substantially different in at least one of size or location from the first area.

* * * * *